(12) United States Patent
Chen et al.

(10) Patent No.: US 9,000,532 B2
(45) Date of Patent: Apr. 7, 2015

(54) VERTICAL PMOS FIELD EFFECT TRANSISTOR AND MANUFACTURING METHOD THEREOF

(71) Applicant: Inotera Memories, Inc., Taoyuan County (TW)

(72) Inventors: Hsin-Huei Chen, Miaoli County (TW); Chung-Yuan Lee, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/316,972

(22) Filed: Jun. 27, 2014

(65) Prior Publication Data

US 2014/0306269 A1   Oct. 16, 2014

Related U.S. Application Data

(62) Division of application No. 12/725,627, filed on Mar. 17, 2010, now Pat. No. 8,802,528.

(30) Foreign Application Priority Data

Dec. 4, 2009  (TW) ............................... 98141479 A

(51) Int. Cl.
*H01L 29/76* (2006.01)
*H01L 29/94* (2006.01)
*H01L 29/78* (2006.01)
*H01L 29/10* (2006.01)
*H01L 29/165* (2006.01)
*H01L 29/66* (2006.01)
*H01L 21/28* (2006.01)
*H01L 29/161* (2006.01)

(52) U.S. Cl.
CPC ......... *H01L 29/7848* (2013.01); *H01L 21/2815* (2013.01); *H01L 29/1054* (2013.01); *H01L 29/161* (2013.01); *H01L 29/165* (2013.01); *H01L 29/66666* (2013.01); *H01L 29/7827* (2013.01); *H01L 29/7846* (2013.01)

(58) Field of Classification Search
USPC ................... 257/368–410, E21.409, E29.085
See application file for complete search history.

(56) References Cited

U.S. PATENT DOCUMENTS 7,491,612 B2 *  2/2009  Schruefer ..................... 257/19
7,825,465 B2 * 11/2010  Pan et al. ..................... 257/332
8,183,640 B2 *  5/2012  Hung et al. ................... 257/369

* cited by examiner

*Primary Examiner* — Cuong Q Nguyen
(74) *Attorney, Agent, or Firm* — Rosenberg, Klein & Lee

(57) ABSTRACT

A PMOS field effect transistor includes a substrate, a first nitride layer, a mesa structure, two gate oxide films, a gate stack layer and a second nitride layer. The substrate has a oxide layer and a first doping area. The first nitride layer is located on the oxide layer. The mesa structure includes a first strained Si—Ge layer, an epitaxial Si layer and a second strained Si—Ge layer. The first strained Si—Ge layer is located on the oxide layer and the first nitride layer. The epitaxial Si layer is located on the first strained Si—Ge layer. The second strained Si—Ge layer is located on the epitaxial Si layer. In the surface layer of the second strained Si—Ge layer, there is a second doping area. The two gate oxide films are located at two sides of the mesa structure.

8 Claims, 6 Drawing Sheets

VERTICAL PMOS FIELD EFFECT TRANSISTOR AND MANUFACTURING METHOD THEREOF

REFERENCE TO RELATED APPLICATION

This Application is being filed as a Divisional Application based on patent application Ser. No. 12/725,627, filed 17 Mar. 2010, currently pending.

BACKGROUND OF THE INVENTION

1. Field of the Invention

The present invention relates to a PMOS field effect transistor and a manufacturing method thereof. In particular, the present invention relates to a vertical PMOS field effect transistor with a strained Si—Ge layer and a manufacturing method thereof.

2. Description of Related Art

In view of the manufacturing process, the MOSFET is the most popular transistor. The current transmission in the MOSFET is to form a channel along the interface to induce the current flow that is implemented by the carrier. The principle is the same as the prior transistor. When the current in the transistor is conducted by electron is called as a NMOS. When the current in the transistor is conducted by hole is called as a PMOS.

Reference is made to FIG. 1. The PMOS of the prior art includes a N-typed substrate 1a, a gate 2a and two gap walls 3a. The N-typed substrate 1a has a first doping area 11a and a second doping area 12a to be used as a source and a drain. On the surface of the N-typed substrate 1a, there is an oxide layer 13a. The gate 2a is located on the oxide layer 13a. The two gap walls 3a are located on the two side walls and the oxide layer 13a. However, because the source, the drain and the gate 2a of the PMOS are disposed in a plane, the transistor occupies most part of the surface area of the N-typed substrate 1a. Therefore, it is difficult to increase the element density of the semiconductor. Currently, the element density of the semiconductor is increased and the size of the transistor is reduced to produce a high density and a high performance semiconductor device. When the size of the transistor is reduced and an advanced manufacturing process is not adopted, the performance of the transistor cannot be enhanced.

SUMMARY OF THE INVENTION

One particular aspect of the present invention is to provide a PMOS field effect transistor and a manufacturing method thereof. The lateral unit area of the transistor is reduced, the element density of the semiconductor is increased, and the transport speed of the transistor carrier is increased to enhance the performance of the transistor.

The PMOS field effect transistor includes a substrate having a oxide layer and a first doping area, a first nitride layer located on the oxide layer, a mesa structure having a first strained Si—Ge layer, an epitaxial Si layer and a second strained Si—Ge layer, two gate oxide films located at two sides of the mesa structure, a gate stack layer located at two sides of the mesa structure and the first oxide layer, and a second nitride layer at two sides of the mesa structure and the gate stack layer. The first nitride layer and the oxide layer have a substrate concave trough that corresponds to the first doping area. The first strained Si—Ge layer is located on the oxide layer and the first nitride layer. The epitaxial Si layer is located on the first strained Si—Ge layer. The second strained Si—Ge layer is located on the epitaxial Si layer. In the surface layer of the second strained Si—Ge layer, there is a second doping area.

Another particular aspect of the present invention is to provide a manufacturing method of a PMOS field effect transistor that includes the following steps.

A substrate is provided.

An oxide layer is formed on the substrate, and a first nitride layer is deposited on the oxide layer.

Part of the first nitride layer and the oxide layer are etched by the photolithography technology to form a substrate concave trough. The surface layer of the substrate that corresponds to the substrate concave trough forms a first doping area.

A first strained Si—Ge layer, an epitaxial Si layer and a second strained Si—Ge layer are deposited on the substrate concave trough and the first nitride layer in order. The surface layer of the second strained Si—Ge layer forms a second doping area.

A buffer oxide layer is formed on the second strained Si—Ge layer, and a hard-mask layer is deposited on the buffer oxide layer.

Part of the hard-mask layer, the buffer oxide layer, the second nitride layer, the epitaxial Si layer and the first strained Si—Ge layer are etched by the photolithography technology to form a mesa structure.

Two sides of the mesa structure form two gate oxide films, and a gate stack layer is deposited on the mesa structure and the first nitride layer.

Part of the gate stack layer is etched to stack the gate stack layer on the two sides of the mesa structure and the first nitride layer.

A second nitride layer is deposited on the mesa structure, the gate stack layer and the first nitride layer.

Finally, part of the second nitride layer and the first nitride layer are etched by the photolithography technology to make the second nitride layer be stacked on the two sides of the mesa structure and the gate stack layer.

The PMOS field effect transistor and a manufacturing method thereof of the present invention has the following characteristics.

1. The present invention is a vertical transistor. The drain, the gate, and the source of the transistor are vertically disposed to reduce the lateral unit area of the transistor and increase the element density of the semiconductor.

2. The epitaxial Si layer is located between the first strained Si—Ge layer and the second strained Si—Ge layer. The first strained Si—Ge layer and the second strained Si—Ge layer provides a vertical stress force to the epitaxial Si layer to increase the hole mobility and enhance the performance of the transistor.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
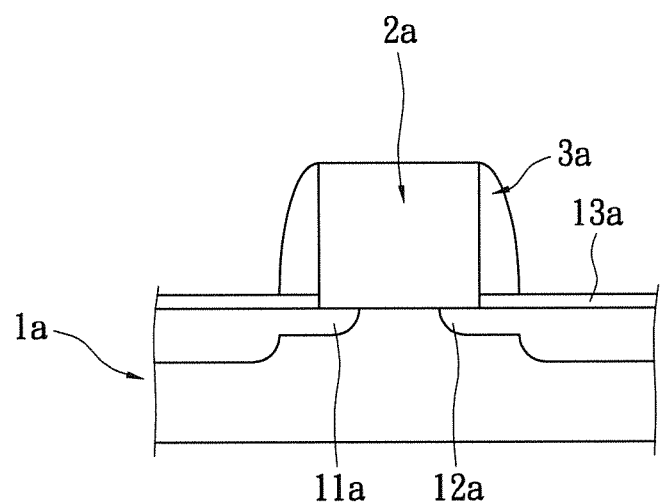
FIG. 1 is a cross-sectional diagram of the PMOS field effect transistor of the prior art.
Figure 2:
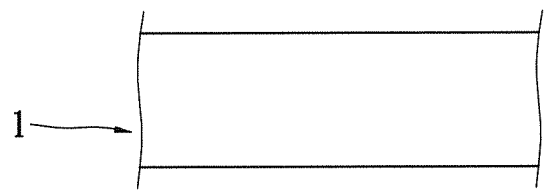
FIG. 2 is a first cross-sectional diagram of the manufacturing method for a PMOS field effect transistor of the present invention.

Reference is made to FIGS. 2-11, which show the steps of the manufacturing method for a PMOS field effect transistor of the present invention. The manufacturing method for a PMOS field effect transistor of the present invention can be applied to the transistor for a DRAM. Reference is made to FIG. 2, which shows the step 1. A N-type Si substrate 1 is provided, which N-type means phosphorus doped wafer.

Figure 3:
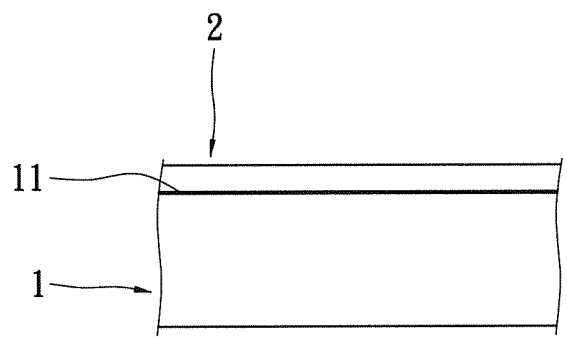
FIG. 3 is a second cross-sectional diagram of the manufacturing method for a PMOS field effect transistor of the present invention.

Reference is made to FIG. 3, which shows the step 2. A substrate oxide layer 11 is formed on the substrate 1 by thermal oxidation method. A first nitride layer 2 is deposited on the substrate oxide layer 11. The first nitride layer 2 is a isolation layer. In this embodiment, the first nitride layer 2 is composed of nitride silicon. In other embodiment, the first nitride layer 2 also can be composed of phosphorous silicon glass or boron phosphorous silicon glass.

Figure 4:
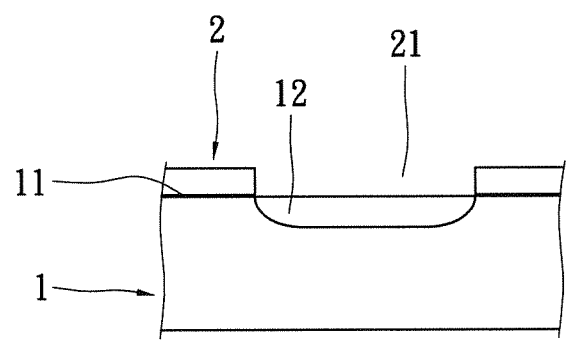
FIG. 4 is a third cross-sectional diagram of the manufacturing method for a PMOS field effect transistor of the present invention.

Reference is made to FIG. 4, which shows the step 3. A pattern of a substrate concave trough 21 is defined on the first nitride layer 2 by using the photolithography technology. The pattern is etched to form the substrate concave trough 21. The substrate concave trough 21 is located on the first nitride layer 2 and the substrate oxide layer 11. The surface layer of the substrate 1 that corresponds to the substrate concave trough 21 is doped an ionized dopant by an implantation way to form a first doping area 12 ($P^+$) and be used as a source or a drain.

Figure 5:
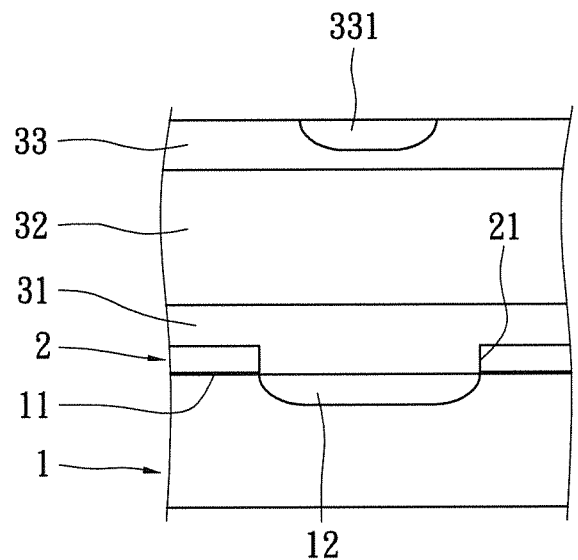
FIG. 5 is a fourth cross-sectional diagram of the manufacturing method for a PMOS field effect transistor of the present invention.

Reference is made to FIG. 5, which shows the step 4. A first strained Si—Ge layer 31, an epitaxial Si layer 32 and a second strained Si—Ge layer 33 are deposited on the substrate concave trough 21 and the first nitride layer 2 in order. The first strained Si—Ge layer 31, the epitaxial Si layer 32 and the second strained Si—Ge layer 33 are made of conducting material and the first strained Si—Ge layer 31 and the second strained Si—Ge layer 33 has a graded doping concentration. Part of the bottom of the first strained Si—Ge layer 31 contacts the first doping area 12 to be electrically connected. Next, the surface layer of the second strained Si—Ge layer 33 is doped an ionized dopant by an implantation way to form a second doping area 331 ($P^+$) and be used as a source or a drain. There is a channel (not shown in the figure) between the first doping area 12 and the second doping area 331 to be a path of an electronic flow. The length and the width of the channel is a key factor of the performance of the transistor. Before the first strained Si—Ge layer 31, the epitaxial Si layer 32 and the second strained Si—Ge layer 33 are deposited on the substrate concave trough 21 and the first nitride layer 2, a step of cleaning the surface of the substrate concave trough 21 and the first nitride layer 2 by the etching liquid to smooth the surface is included.

Figure 6:
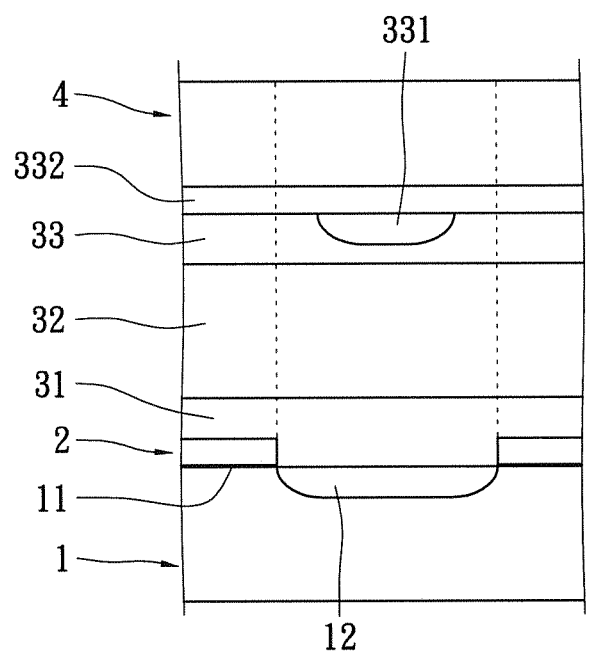
FIG. 6 is a fifth cross-sectional diagram of the manufacturing method for a PMOS field effect transistor of the present invention.

Reference is made to FIG. 6, which shows the step 5. A buffer oxide layer 332 is formed on the second strained Si—Ge layer 33. Next, a hard-mask layer 4 is deposited on the buffer oxide layer 332. The hard-mask layer 4 is composed of nitride for protecting the mesa structure. A pattern (to be a pattern of the mesa structure, the dash line in FIG. 6) is defined on the hard-mask layer 4 by using the photolithography technology.

Figure 7:
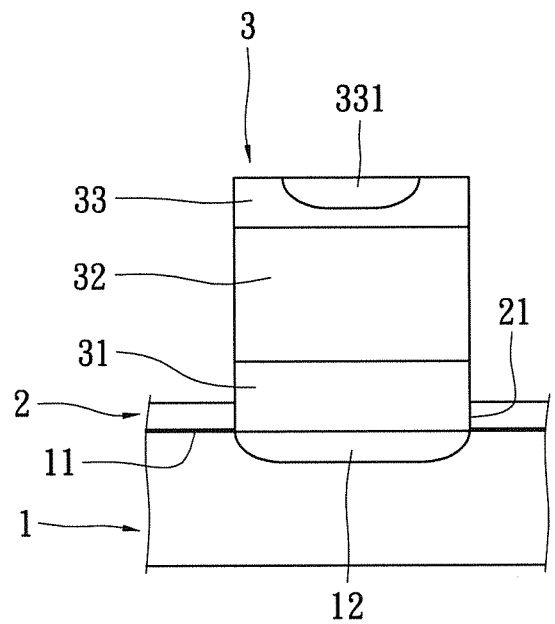
FIG. 7 is a sixth cross-sectional diagram of the manufacturing method for a PMOS field effect transistor of the present invention.

Reference is made to FIGS. 6 and 7, which shows the step 6. The hard-mask layer 4, the buffer oxide layer 332, the second nitride layer 33, the epitaxial Si layer 32 and the first strained Si—Ge layer 31 that do not include the pattern are etched. Next, the remainder of the hard-mask layer 4 and the buffer oxide layer 332 are etched to reserve the second nitride layer 33, the epitaxial Si layer 32 and the first strained Si—Ge layer 31 to form a mesa structure 3. The epitaxial Si layer 32 is used as a gate.

Figure 8:
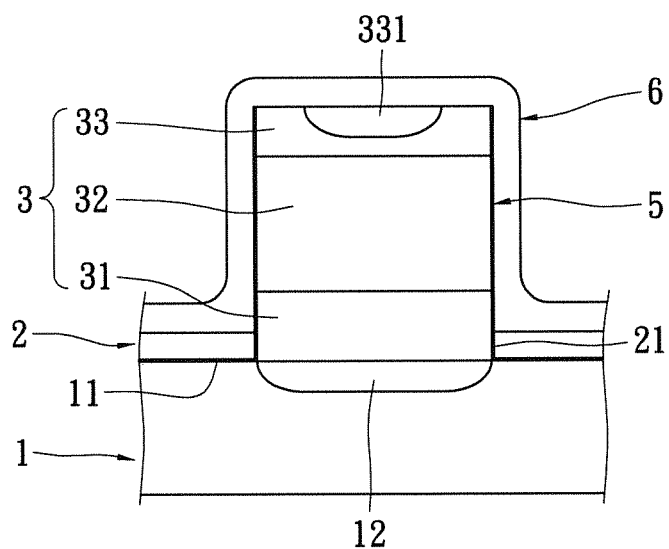
FIG. 8 is a seventh cross-sectional diagram of the manufacturing method for a PMOS field effect transistor of the present invention.

Reference is made to FIG. 8, which shows the step 7. Two sides of the mesa structure 3 form two gate oxide films 5 by a thermal oxidation method to provide a dielectic layer. A gate stack layer 6 is deposited on the mesa structure 3, the gate oxide films 5 and the first nitride layer 2. The gate stack layer 6 is composed of poly-silicon, or conducting materials.

Figure 9:
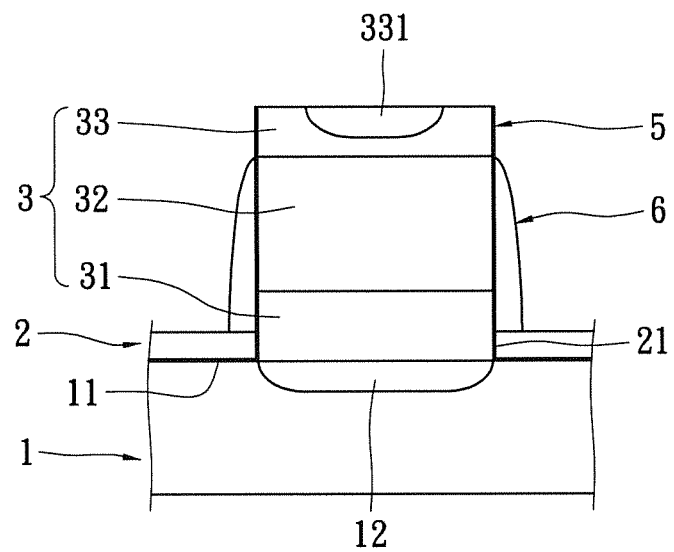
FIG. 9 is a eighth cross-sectional diagram of the manufacturing method for a PMOS field effect transistor of the present invention.

Reference is made to FIG. 9, which shows the step 8. Part of the gate stack layer 6 is etched by an anisotropy etching method to make the gate stack layer 6 be stacked on the first strained Si—Ge layer 31, the two sides of the epitaxial Si layer 32 and the first nitride layer 2.

Figure 10:
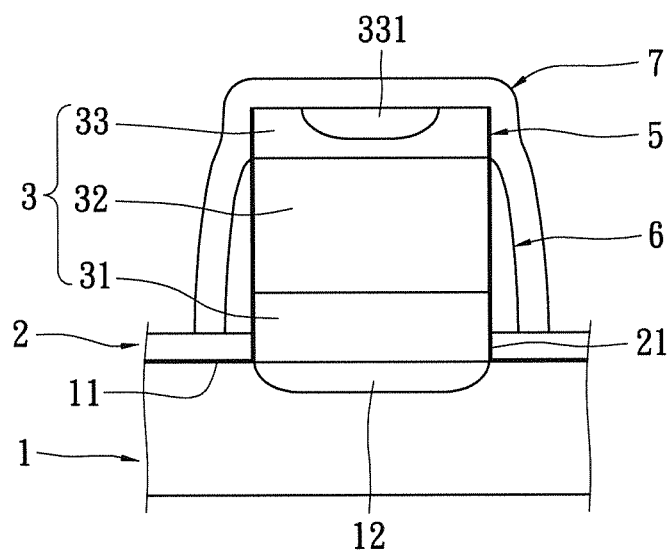
FIG. 10 is a ninth cross-sectional diagram of the manufacturing method for a PMOS field effect transistor of the present invention.

Reference is made to FIG. 10, which shows the step 9. A second nitride layer 7 is deposited on the mesa structure 3, the gate stack layer 6 and the first nitride layer 2. The second nitride layer 7 is a dielectric layer. In this embodiment, the second nitride layer 7 is composed of nitride silicon. In other embodiment, the second nitride layer 7 also can be composed of phosphorous silicon glass or boron phosphorous silicon glass.

Figure 11:
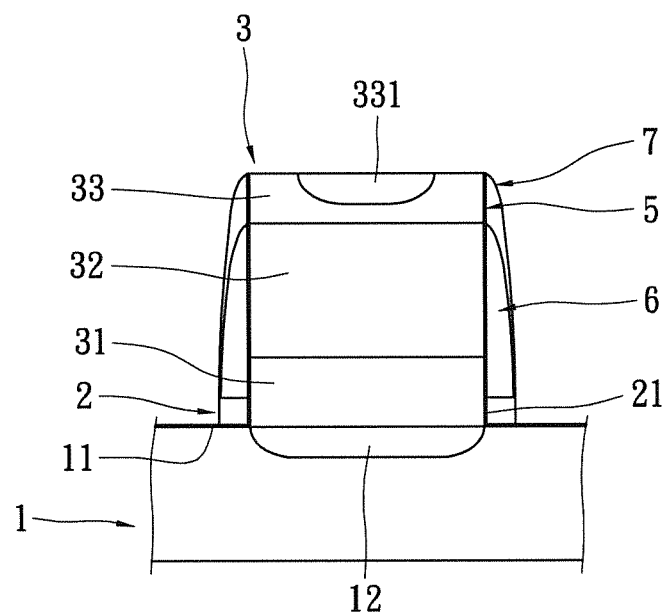
FIG. 11 is a tenth cross-sectional diagram of the manufacturing method for a PMOS field effect transistor of the present invention.

Reference is made to FIG. 11, which shows the step 10. Part of the second nitride layer 7 and the first nitride layer 2 are etched by an anisotropy etching method to make the second nitride layer 7 be stacked at the two sides of the mesa structure 3 and the gate stack layer 6. The transistor is finished.

The PMOS field effect transistor and a manufacturing method thereof of the present invention has the following characteristics.

1. The present invention is a vertical transistor. The drain, the gate, and the source of the transistor are vertically disposed to reduce the lateral unit area of the transistor and increase the element density of the semiconductor.

2. The epitaxial Si layer 32 is located between the first strained Si—Ge layer 31 and the second strained Si—Ge layer 32. The first strained Si—Ge layer 31 and the second strained Si—Ge layer 32 provides a vertical stress force to the epitaxial Si layer 32. The distance between two Si atoms of the epitaxial Si layer 32 is reduced to increase the hole mobility and enhance the performance of the PMOS field effect transistor.

Furthermore, the first nitride layer 2 is located at two sides of the mesa structure 3 that is close to the bottom. The second nitride layer 7 is located on the gate stack layer 6, and is located at two sides of the mesa structure 3 that is close to the top. Therefore, strain is generated to increase the hole mobility and enhance the performance of the PMOS field effect transistor.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A PMOS field effect transistor, comprising:
    a substrate having an oxide layer and a first doping area;
    a first nitride layer located on the oxide layer, wherein the first nitride layer and the oxide layer have a substrate-concave trough that corresponds to the first doping area;
    a mesa structure having a first strained Si—Ge layer, an epitaxial Si layer and a second strained Si—Ge layer, wherein the first strained Si—Ge layer is located on the oxide layer and the first nitride layer, the epitaxial Si layer is located on the first strained Si—Ge layer, the second strained Si—Ge layer is located on the epitaxial Si layer, and there is a second doping area in the surface layer of the second strained Si—Ge layer;
    two gate oxide films located at two sides of the mesa structure;
    a gate stack layer located at two sides of the mesa structure and the first oxide layer; and
    a second nitride layer at two sides of the mesa structure and the gate stack layer.

2. The PMOS field effect transistor as claimed in claim 1, wherein the substrate is a N-typed Si substrate.

3. The PMOS field effect transistor as claimed in claim 1, wherein the first strained Si—Ge layer has a graded doping concentration.

4. The PMOS field effect transistor as claimed in claim 1, wherein the second strained Si—Ge layer has a graded doping concentration.

5. The PMOS field effect transistor as claimed in claim 1, wherein the gate stack layer is composed of poly-silicon.

6. The PMOS field effect transistor as claimed in claim 1, wherein the first nitride layer is composed of nitride silicon.

7. The PMOS field effect transistor as claimed in claim 1, wherein the second nitride layer is composed of nitride silicon.

8. The PMOS field effect transistor as claimed in claim 1, wherein the first doping area is used as a source, and the second doping area is used as a drain.

* * * * *